United States Patent
Yang et al.

(10) Patent No.: US 10,522,585 B2
(45) Date of Patent: Dec. 31, 2019

(54) METHOD FOR MANUFACTURING CMOS IMAGE SENSOR

(71) Applicant: TAIWAN SEMICONDUCTOR MANUFACTURING CO., LTD., Hsinchu (TW)

(72) Inventors: Yi-Fang Yang, Tainan (TW); Yi-Hung Chen, Kaohsiung (TW); Keng-Ying Liao, Tainan (TW); Yi-Jie Chen, Tainan (TW); Shih-Hsun Hsu, Tainan (TW); Chun-Chi Lee, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/488,658

(22) Filed: Apr. 17, 2017

(65) Prior Publication Data

US 2018/0301501 A1 Oct. 18, 2018

(51) Int. Cl.
*H01L 27/146* (2006.01)

(52) U.S. Cl.
CPC .... *H01L 27/14685* (2013.01); *H01L 27/1462* (2013.01); *H01L 27/1464* (2013.01); *H01L 27/14649* (2013.01)

(58) Field of Classification Search
CPC ........... H01L 27/14685; H01L 27/1462; H01L 27/14649; H01L 27/1464; H01L 31/0543
See application file for complete search history.

(56) References Cited

U.S. PATENT DOCUMENTS

| 2009/0085143 A1* | 4/2009 | Park | H01L 27/14603 257/459 |
| 2010/0117173 A1* | 5/2010 | Yun | H01L 21/76898 257/431 |
| 2013/0001724 A1* | 1/2013 | Masuda | H01L 27/14623 257/432 |
| 2015/0294997 A1* | 10/2015 | Kim | H01L 27/1463 257/432 |

* cited by examiner

*Primary Examiner* — Cory W Eskridge
(74) *Attorney, Agent, or Firm* — McClure, Qualey & Rodack, LLP

(57) ABSTRACT

A semiconductor device includes a substrate, a conductive layer, a transparent layer, a transparent hard mask layer, a carrier, and a device layer. The substrate has a first surface and a second surface opposite to each other. The conductive layer is disposed on the first surface of the substrate. The transparent layer is disposed on the conductive layer. The transparent hard mask layer is disposed on the transparent layer, in which the substrate has an etch selectivity with respect to the transparent hard mask layer. The device layer is disposed between the carrier and the second surface of the substrate, in which various portions of the device layer are respectively exposed by various through holes which pass through the transparent hard mask layer, the transparent layer, the conductive layer, and the substrate.

20 Claims, 6 Drawing Sheets

METHOD FOR MANUFACTURING CMOS IMAGE SENSOR

BACKGROUND

Semiconductor image sensors are operated to sense light. Typically, the semiconductor image sensors include complementary metal-oxide-semiconductor (CMOS) image sensors (CIS) and charge-coupled device (CCD) sensors, which are widely used in various applications such as digital still camera (DSC), mobile phone camera, digital video (DV) and digital video recorder (DVR) applications. These semiconductor image sensors utilize an array of image sensor elements, each image sensor element including a photodiode and other elements, to absorb light and convert the sensed light into digital data or electrical signals.

Front side illuminated (FSI) CMOS image sensors and back side illuminated (BSI) CMOS image sensors are two types of CMOS image sensors. The FSI CMOS image sensors are operable to detect light projected from their front side while the BSI CMOS image sensors are operable to detect light projected from their backside. When light projected into the FSI CMOS image sensors or the BSI CMOS image sensors, photoelectrons are generated and then are sensed by light-sensing devices in pixels of the image sensors. The more the photoelectrons are generated, the more superior quantum efficiency (QE) the image sensor has, thus improving the image quality of the CMOS image sensors.

However, while CMOS image sensor technologies are rapidly developed, CMOS image sensors with higher image quality are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
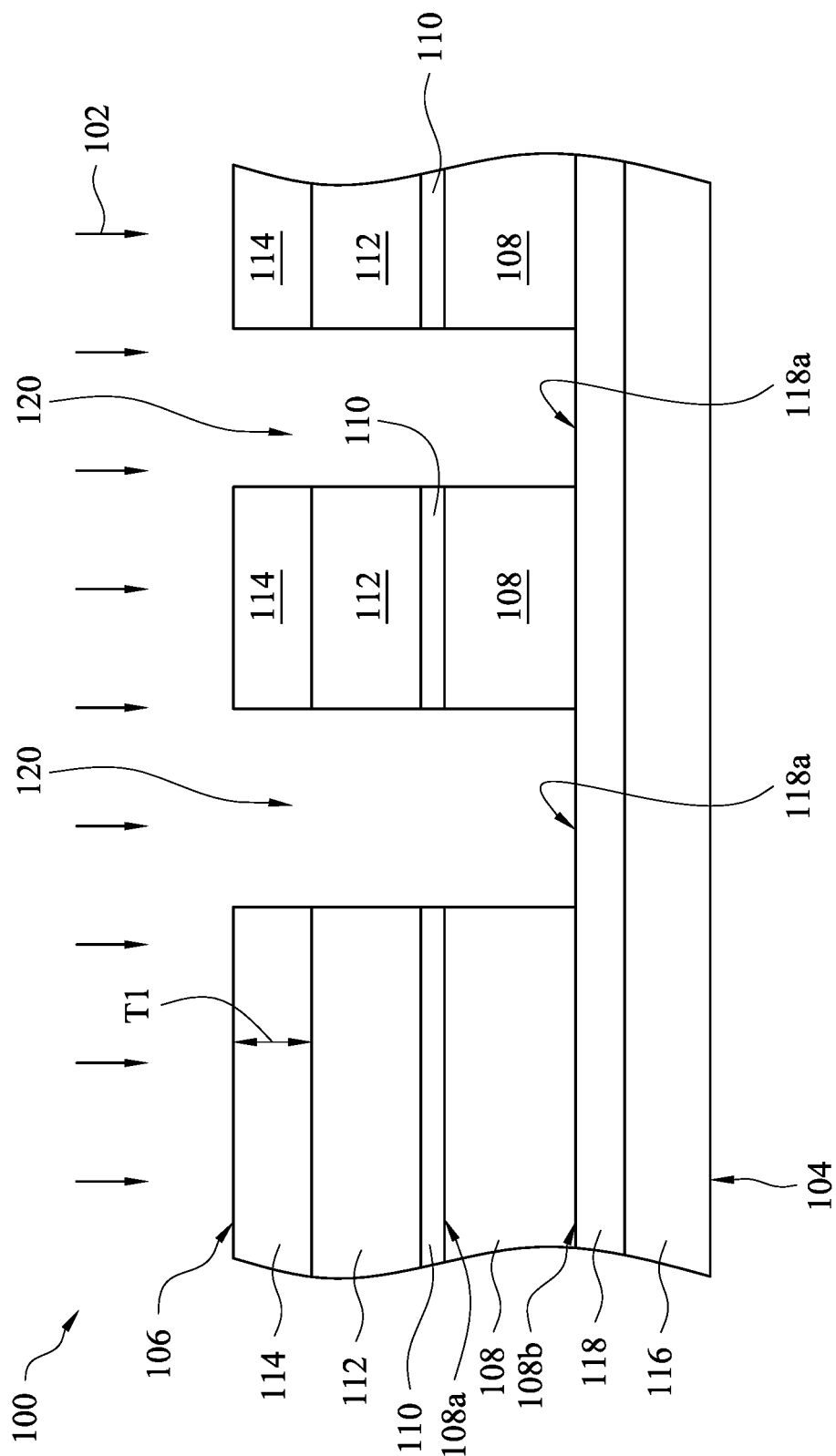
FIG. 1 is a schematic cross-sectional view of a semiconductor device in accordance with various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. In addition, the present disclosure may repeat reference numerals and/or letters in the various examples. This repetition is for the purpose of simplicity and clarity and does not in itself dictate a relationship between the various embodiments and/or configurations discussed. As used herein, the term "and/or" includes any and all combinations of one or more of the associated listed items.

In a typical process for manufacturing a CMOS image sensor, after a substrate is bonded to a carrier, a photo-resist layer is formed on a transparent layer on the substrate and is patterned to expose portions of the transparent layer, and then an etch process is performed on the exposed portions of the transparent layer, a conductive layer underlying the transparent layer on the substrate, and the substrate until the substrate is etched through. In some applications, the substrate is very thick, such that the photo-resist layer must have sufficient thickness to resist the etchant during the etch process. However, it is very difficult to form the photo-resist layer having a large thickness, and the uniformity of the thicker photo-resist layer is typically poor. Thus, it has become a bottleneck for etching the thicker substrate. In addition, a polymer containing metal is formed during the etching of the conductive layer and is adhered to a sidewall of the photo-resist layer, such that the photo-resist layer must be removed by using an ashing process with pure oxygen. In addition, after the photo-resist layer is removed, the polymer containing metal falls to a pixel region, and thus decreasing yield of the CMOS image sensor.

Embodiments of the present disclosure are directed to providing a semiconductor device and a method for manufacturing the semiconductor device, in which a transparent hard mask layer is formed on a transparent layer on a substrate, and the transparent hard mask layer has an etch selectivity with respect to the substrate. The transparent hard mask layer and an etch mask layer are used as etch masks during an etch process of the substrate, such that the etch mask layer on the transparent hard mask layer does not need a large thickness and can be formed easily. Furthermore, with the protection of the transparent hard mask layer, the etch mask layer can be removed by a wet process, and the polymer containing metal adhered to the etch mask layer is removed during the wet process, such that a process window is enlarged, and the yield of the semiconductor device is enhanced.

FIG. 1 is a schematic cross-sectional view of a semiconductor device in accordance with various embodiments. In some embodiments, a semiconductor device 100 is a CMOS image sensor device, which may be operated for sensing incident light 102. The semiconductor device 100 has a front side 104 and a back side 106. In some examples, the semiconductor device 100 is a BSI CMOS image sensor device, which is operated to sense the incident light 102 projected from its back side 106. In some exemplary examples, the semiconductor device 100 is a near infrared (NIR) CMOS image sensor device, and is operated for sensing near infrared of the incident light 102.

As shown in FIG. 1, the semiconductor device 100 includes a substrate 108, a conductive layer 110, a transparent layer 112, a transparent hard mask layer 114, a carrier 116, and a device layer 118. The substrate 108 may be a semiconductor substrate. The substrate 108 may be composed of a single-crystalline semiconductor material or a compound semiconductor material. For example, silicon, germanium or glass may be used as a material of the substrate 108. The substrate 108 has a first surface 108a and a second surface 108b, which are at opposite sides of the substrate 108.

The conductive layer 110 is disposed on the first surface 108a of the substrate 108. The conductive layer 110 may include metal or metal compound. In some exemplary examples, the conductive layer 110 includes hafnium oxide ($HfO_2$) and/or tantalum pentoxide ($Ta_2O_5$). In some certain examples, the conductive layer 110 further includes silicon dioxide.

The transparent layer 112 is disposed on the conductive layer 110. In the examples that the semiconductor device 100 is the near infrared CMOS image sensor device, the transparent layer 112 is pervious to near infrared. For example, a reflective index (RI) of the transparent layer 112 may be equal to or smaller than about 1.462. In some examples, the transparent layer 112 includes low deposition-rate resistor protection oxide (LRPO). For example, the transparent layer 112 may include silicon dioxide.

The transparent hard mask layer 114 is disposed on the transparent layer 112. The substrate 108 has an etch selectivity with respect to the transparent hard mask layer 114, and an etch rate of the substrate 108 is greater than an etch rate of the transparent hard mask layer 114. In some exemplary examples, the etch selectivity is substantially greater than 3. In the examples that the semiconductor device 100 is the near infrared CMOS image sensor device, the transparent hard mask layer 114 is pervious to near infrared. For example, a reflective index of the transparent hard mask layer 114 may be equal to or smaller than about 1.46. In some exemplary examples, the transparent hard mask layer 114 includes undoped silicon glass (USG). In addition, for the concern of the process window, the transmittance of the transparent hard mask layer 114, and the crosstalking problem of light, the transparent hard mask layer 114 preferably has an appropriate thickness T1. In some exemplary examples, the thickness T1 of the transparent hard mask layer 114 ranges from 1000 angstrom to 2000 angstrom.

The device layer 118 is formed on the second surface 108b of the substrate 108. In some examples, the device layer 118 includes various image sensors. The device layer 118 may further include various interconnect structures and various isolation structures. In the examples that the semiconductor device 100 is the near infrared CMOS image sensor device, the device layer 118 includes various near-infrared image sensors. The device layer 118 is bonded to the carrier 116, such that the device layer 118 is located between the carrier 116 and the second surface 108b of the substrate 108. The semiconductor device 100 has various through holes 120, in which the through holes 120 pass through the transparent hard mask layer 114, the transparent layer 112, the conductive layer 110, and the substrate 108, and respectively expose portions 118a of the device layer 118. Various contacts may be formed in some of the through holes 120 to electrically connect to the image sensors and the interconnect structures of the device layer 118. The carrier 116 may be formed from semiconductor materials. The carrier 116 may be composed of a single-crystalline semiconductor material or a compound semiconductor material. In some exemplary examples, silicon, germanium or glass may be used as a material of the carrier 116.

Figure 2A:
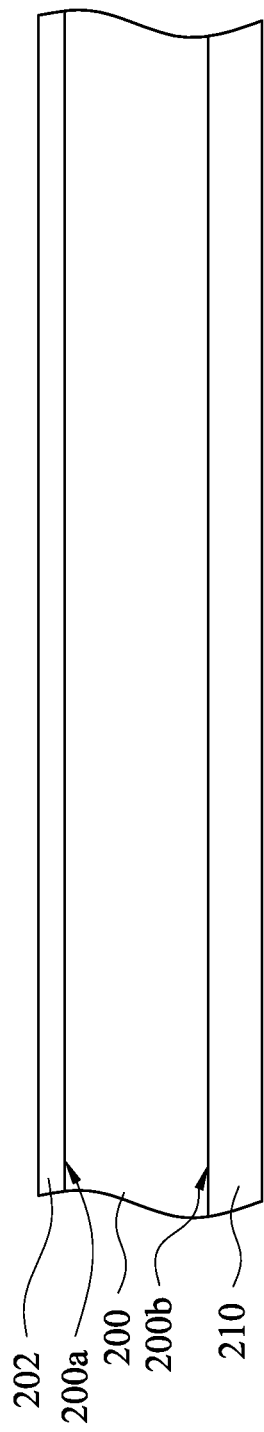
FIG. 2A through FIG. 2F are schematic cross-sectional views of intermediate stages showing a method for manufacturing recesses in a surface of a substrate of a semiconductor device in accordance with various embodiments.

Referring to FIG. 2A through FIG. 2F, FIG. 2A through FIG. 2F are schematic cross-sectional views of intermediate stages showing a method for manufacturing a semiconductor device in accordance with various embodiments. As shown in FIG. 2A, a substrate 200 is provided. In some examples, the substrate 200 is a semiconductor substrate. For example, the substrate 200 may be composed of a single-crystalline semiconductor material or a compound semiconductor material. In some exemplary examples, silicon, germanium or glass may be used as a material of the substrate 200. The substrate 200 has a first surface 200a and a second surface 200b, which are opposite to each other.

Referring to FIG. 2A again, the operation of providing the substrate 200 includes forming a device layer 210 on the second surface 200b of the substrate 200. In some examples, the device layer 210 is formed to include various image sensors. The device layer 210 may be formed to further include various interconnect structures and various isolation structures. In the examples that the semiconductor device is the near infrared CMOS image sensor device, the device layer 210 is formed to include various near-infrared image sensors. For example, the device layer 210 may be formed by using a deposition technique, a photolithography technique, and an etch technique.

As shown in FIG. 2A, a conductive layer 202 is formed on the first surface 200a of the substrate 200. In some examples, the conductive layer 202 is formed by using a deposition process, such as a chemical vapor deposition (CVD) process and a physical vapor deposition (PVD) process. For example, the physical vapor deposition process may be a sputtering deposition process. The conductive layer 202 may be formed to include metal or metal compound. In some exemplary examples, the conductive layer 202 is formed to include hafnium oxide and/or tantalum pentoxide. In some certain examples, the conductive layer 202 is formed to further include silicon dioxide.

Figure 2B:
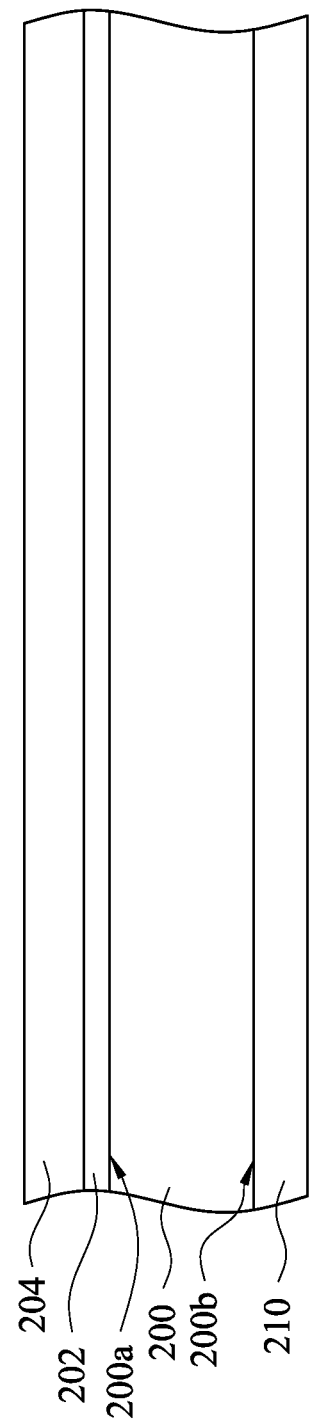

As shown in FIG. 2B, a transparent layer 204 is formed on the conductive layer 202. In some examples, the transparent layer 204 is formed by using a deposition process, such as a chemical vapor deposition process. The chemical vapor deposition process may be a plasma-enhanced chemical vapor deposition (PECVD) process. The transparent layer 204 is pervious to light. In some examples that the semiconductor device is formed to be a near infrared CMOS image sensor device, the transparent layer 204 is pervious to near infrared. For example, a reflective index of the transparent layer 204 may be equal to or smaller than about 1.462. In some examples, the transparent layer 204 is formed to include low deposition-rate resistor protection oxide. For example, the transparent layer 204 may be formed to include silicon dioxide. In certain examples, an etch selectivity between the transparent layer 204 and the substrate is substantially equal to 1, that is an etch rate of the transparent layer 204 is substantially the same as an etch rate of the substrate 200.

Figure 2C:
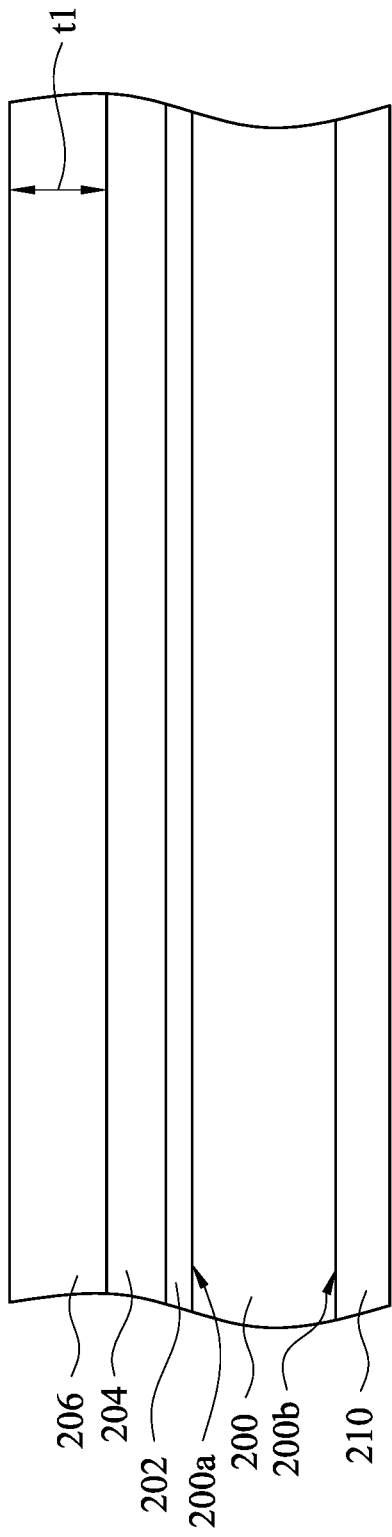

In some examples, as shown in FIG. FIG. 2C, a transparent hard mask layer 206 is formed on the transparent layer 204. In some exemplary examples, the transparent hard mask layer 206 is formed by using a deposition process, such as a chemical vapor deposition process. The chemical vapor deposition process may be a plasma-enhanced chemical vapor deposition process. The transparent hard mask layer 206 acts as an auxiliary etch mask during a subsequent etch process of the substrate 200. Thus, the substrate 200 has an etch selectivity with respect to the transparent hard mask layer 206, and an etch rate of the substrate 200 is greater than an etch rate of the transparent hard mask layer 206. In some exemplary examples, the etch selectivity is substantially greater than 3.

The transparent hard mask layer 206 is pervious to light. In some examples that the semiconductor device is the near infrared CMOS image sensor device, the transparent hard mask layer 206 is pervious to near infrared. For example, a reflective index of the transparent hard mask layer 206 may be equal to or smaller than about 1.46. In some examples, the transparent hard mask layer 206 is formed to include undoped silicon glass. The transparent hard mask layer 206 may be composed of a single-layered structure or a multi-layered structure.

In some examples, for effectively protecting the transparent layer 204 during the etching process of the substrate 200, the transparent hard mask layer 206 is formed to have a thickness t1, which is greater than about 3000 angstrom. In some exemplary examples, for the concern of the transmittance of the transparent hard mask layer 206 remained after the etch process and the crosstalking problem of light, the thickness t1 of the transparent hard mask layer 206 is preferably not too large, and the thickness t1 of the transparent hard mask layer 206 preferably ranges from about 3000 angstrom to about 4000 angstrom.

Figure 2D:
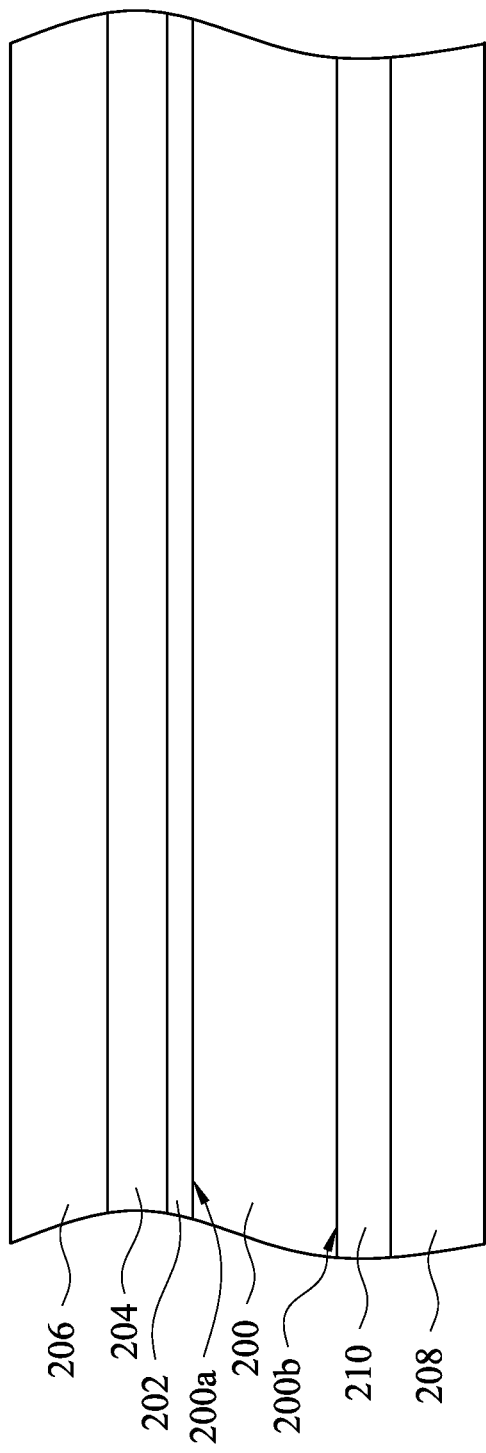

In some examples, as shown in FIG. 2D, a carrier 208 is provided to carry the substrate 200, and the conductive layer 202, the transparent layer 204, the transparent hard mask layer 206, and the device layer 210 disposed thereon. The carrier 208 may be formed from semiconductor materials. For example, the carrier 208 may be composed of a single-crystalline semiconductor material or a compound semiconductor material. In some exemplary examples, silicon, germanium or glass may be used as a material of the carrier 208. The device layer 210 on the second surface 200b of the substrate 200 is bonded to the carrier 208. In the example illustrated in FIG. 2C and FIG. 2D, the operation of forming the transparent hard mask layer 206 is performed before the device layer 210 on the second surface 200b of the substrate 200 is bonded to the carrier 208. In certain examples, the operation of forming the transparent hard mask layer 206 may be performed after the device layer 210 on the second surface 200b of the substrate 200 is bonded to the device layer 210. For example, the conductive layer 202, the transparent layer 204, and the transparent hard mask layer 206 may be formed before the device layer 210 is bonded to the carrier 208, or after the device layer 210 is bonded to the carrier 208.

Figure 2E:
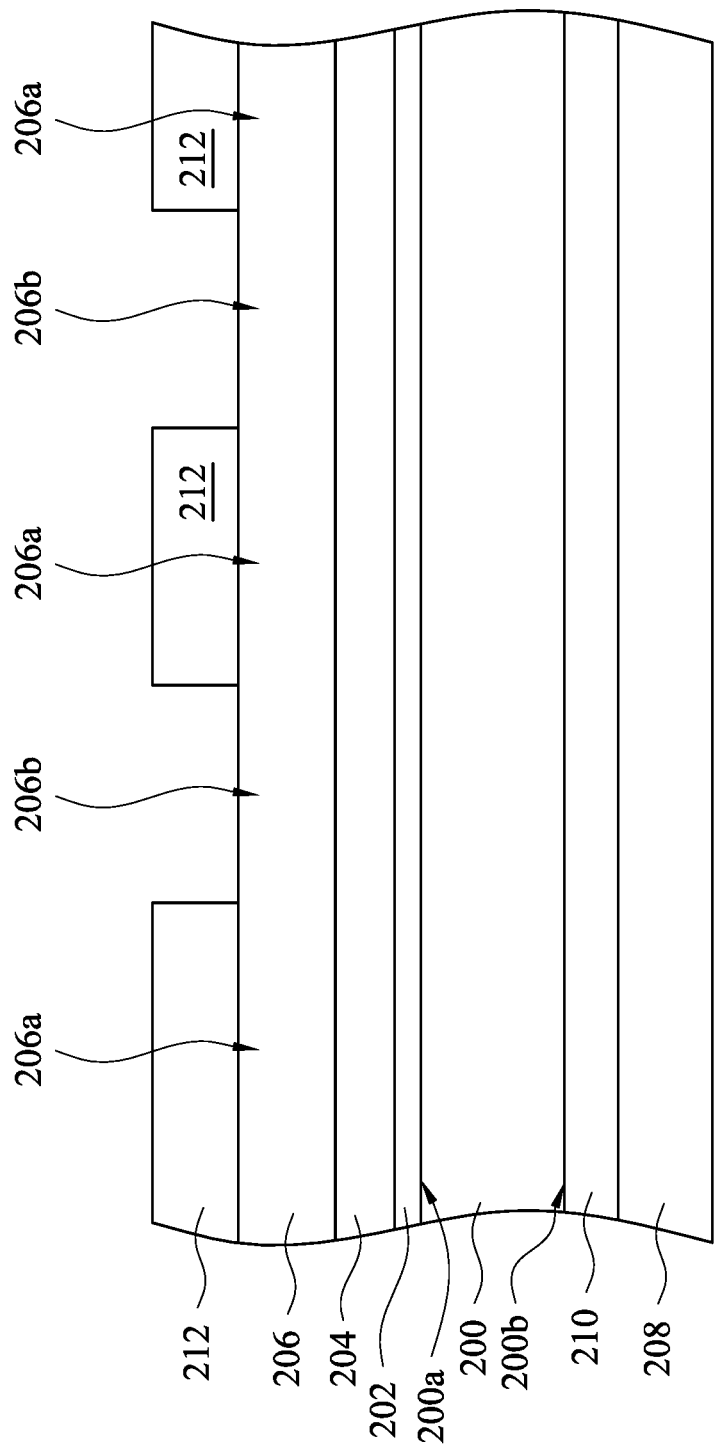

As shown in FIG. 2E, a patterned etch mask layer 212 is formed on the transparent hard mask layer 206. The transparent hard mask layer 206 includes various first portions 206a and various second portions 206b, in which the patterned etch mask layer 212 is disposed on the first portions 206a, and the second portions 206b are exposed. In some exemplary examples, the patterned etch mask layer 212 is formed from photo-resist, and the operation of forming the patterned etch mask layer 212 includes blanketly forming an etch mask layer to cover the transparent hard mask layer 206, and performing a photolithography process on the etch mask layer to remove portions of the etch mask layer so as to form the patterned etch mask layer 212.

In certain examples, the patterned etch mask layer 212 is not formed from a photo-resist, and the operation of forming the patterned etch mask layer 212 includes blanketly forming an etch mask layer to cover the transparent hard mask layer 206, and performing a photolithography process and an etch process on the etch mask layer to remove portions of the etch mask layer, so as to form the patterned etch mask layer 212 on the first portions 206a of the transparent hard mask layer 206.

Figure 2F:
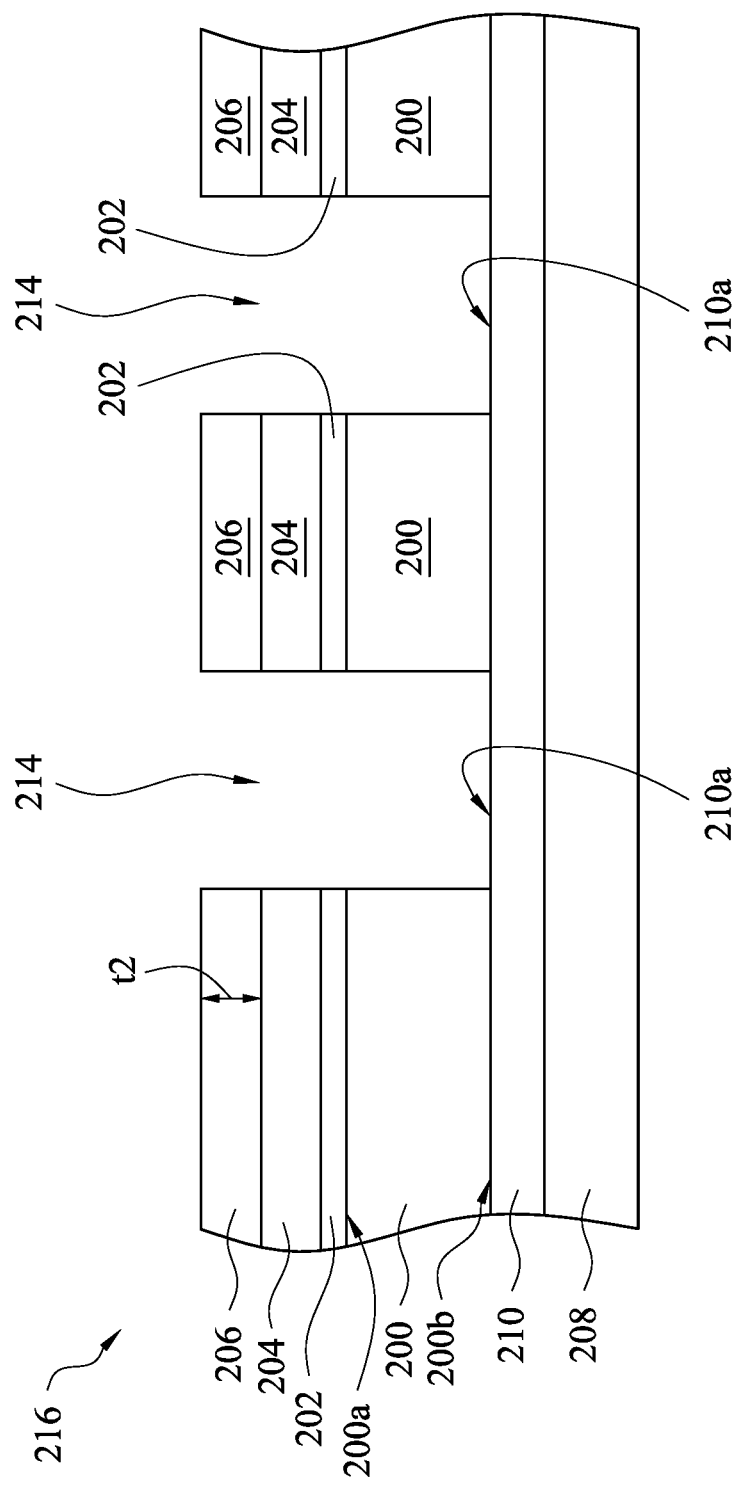

In some examples, referring to FIG. 2E again, an etch process is performed through the patterned etch mask layer 212 to remove the second portions 206b of the transparent hard mask layer 206, various portions of the transparent layer 204, various portions of the conductive layer 202, and various portions of the substrate 200, in which the portions of the transparent layer 204, the portions of the conductive layer 202, and the portions of the substrate 200 underlie the second portions 206b of the transparent hard mask layer 206. The portions of the substrate 200 are removed from the first surface 200a to the second surface 200b of the substrate 200. As shown in FIG. 2F, after the etching process is completed, various through holes 214 are formed to pass through the transparent hard mask layer 206, the transparent layer 204, the conductive layer 202, and the substrate 200, and to respectively expose various portions 210a of the device layer 210. In some examples, the etch process is performed by using a dry etch technique. In some exemplary examples, some of the through holes 214 expose the image sensors and the interconnect structures of the device layer 210, and various contacts may be formed in these through holes 214 to electrically connect to the image sensors and the interconnect structures of the device layer 210.

In some exemplary examples, referring to FIG. 2E again, in the etch process, the second portions 206b of the transparent hard mask layer 206 and the portions of the transparent layer 204 are etched through the patterned etch mask layer 212 to expose the portions of the conductive layer 202, and the portions of the conductive layer 202 are etched through the patterned etch mask layer 212 and the transparent hard mask layer 206, and then the portions of the substrate 200 are etched through the transparent hard mask layer 206, or through the patterned etch mask layer 212 and the transparent hard mask layer 206.

In some examples, after the etch process is completed, portions of the patterned etch mask layer 212 may be still remained, such that the patterned etch mask layer 212 can protect a top surface of the transparent hard mask layer 206 and a top surface of the transparent layer 204 from the etchant during the etching of the substrate 200, and the substrate 200 is etched through the patterned etch mask layer 212. The remained patterned etch mask layer 212 is removed after the etch process to substantially complete a semiconductor device 216. For example, the remained patterned etch mask layer 212 may be removed by using an ashing process or a wet strip process.

In the examples illustrated in FIG. 2F, the patterned etch mask layer 212 is completely consumed during the etch process, such that the transparent hard mask layer 206 acts as an etch mask to protect the transparent layer 204 during the portions of the substrate 200 are etched. The patterned etch mask layer 212 may be completely consumed during the etching of the substrate 200. In some exemplary examples, after the etch process is completed, a part of the transparent hard mask layer 206 is consumed by the etchant, such that the thickness t1 of the transparent hard mask layer 206 is reduced to a thickness t2. In some exemplary examples, the thickness t2 of the transparent hard mask layer 206 ranges from 1000 angstrom to 2000 angstrom.

With the transparent hard mask layer 206 on the transparent layer 204, the transparent hard mask layer can be used as an etch mask during the etching of the substrate 200, such that it is not necessary for the etch mask layer 212 to have a very sufficient thickness for resisting the etchant during the whole etch process, thereby reducing the difficulty of forming the etch mask layer 212 and increasing the uniformity of the etch mask layer 212. In addition, when a portion of the etch mask layer 212 remains after the etch process, with the protection of the transparent hard mask layer 206, the remaining portion of the etch mask layer 212 can be removed by a wet process, and the polymer containing metal adhered to the etch mask layer 212 is removed during the wet process, such that a process window is enlarged, and the yield of the semiconductor device 216 is enhanced.

Figure 3:
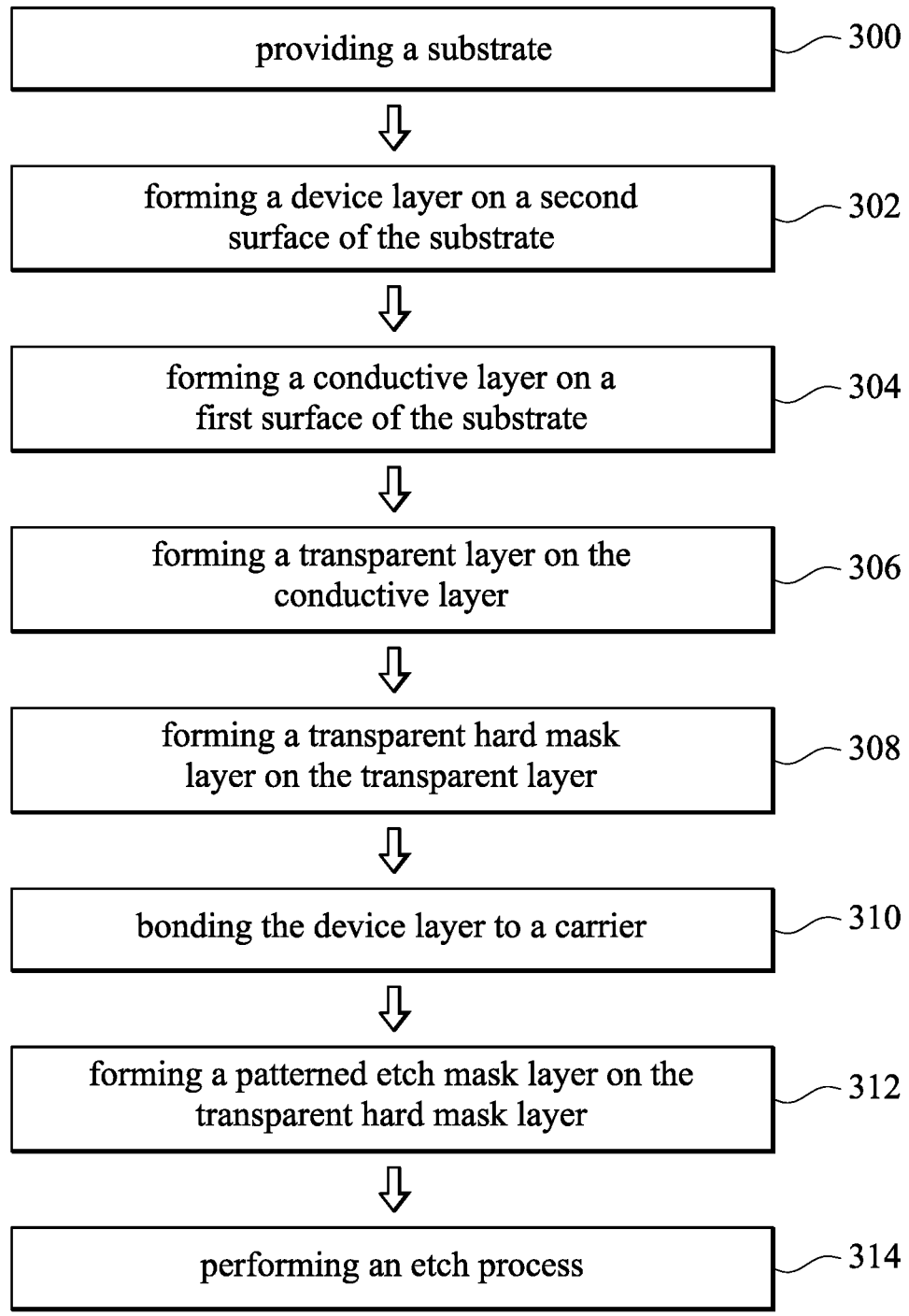
FIG. 3 is a flow chart of a method for manufacturing a semiconductor device in accordance with various embodiments.

Referring to FIG. 3 with FIG. 2A through FIG. 2F, FIG. 3 is a flow chart of a method for manufacturing a semiconductor device in accordance with various embodiments. The method begins at operation 300, where a substrate 200 is provided. As shown in FIG. 2A, the substrate 200 has a first surface 200a and a second surface 200b, which are at opposite sides of the substrate 200. The substrate 200 may be composed of a semiconductor material, such as silicon, germanium or glass.

At operation 302, referring to FIG. 2A again, a device layer 210 is formed on the second surface 200b of the substrate 200. In some examples, the device layer 210 is formed to include various image sensors, various interconnect structures, and various isolation structures. In the examples that the semiconductor device is the near infrared CMOS image sensor device, the device layer 210 is formed to include various near-infrared image sensors. For example, the device layer 210 may be formed by using a deposition technique, a photolithography technique, and an etch technique.

At operation 304, as shown in FIG. 2A, a conductive layer 202 is formed on the first surface 200a of the substrate 200 by using, for example, a deposition process. The deposition process may be a chemical vapor deposition process or a physical vapor deposition process. For example, the physical vapor deposition process may be a sputtering deposition process. In some exemplary examples, the conductive layer 202 is formed to include hafnium oxide and/or tantalum pentoxide. The conductive layer 202 may be formed to further include silicon dioxide.

At operation 306, as shown in FIG. 2B, a transparent layer 204 is formed on the conductive layer 202 by using a deposition process, such as a chemical vapor deposition process. The chemical vapor deposition process may be a plasma-enhanced chemical vapor deposition process. The transparent layer 204 is pervious to light. In some examples that the semiconductor device is formed to be a near infrared CMOS image sensor device, the transparent layer 204 is pervious to near infrared. A reflective index of the transparent layer 204 may be equal to or smaller than about 1.462. In some examples, the transparent layer 204 is formed to include low deposition-rate resistor protection oxide. In certain examples, an etch rate of the transparent layer 204 is substantially the same as an etch rate of the substrate 200.

At operation 308, as shown in FIG. 2C, a transparent hard mask layer 206 is formed on the transparent layer 204 by using a deposition process, such as a chemical vapor deposition process. The chemical vapor deposition process may be a plasma-enhanced chemical vapor deposition process. The transparent hard mask layer 206 acts as an auxiliary etch mask during a subsequent etch process of the substrate 200, such that the substrate 200 has an etch selectivity with respect to the transparent hard mask layer 206, and an etch rate of the substrate 200 is greater than an etch rate of the transparent hard mask layer 206. For example, the etch selectivity may be substantially greater than 3. The transparent hard mask layer 206 is pervious to light. In some examples that the semiconductor device is the near infrared CMOS image sensor device, the transparent hard mask layer 206 is pervious to near infrared, and a reflective index of the transparent hard mask layer 206 may be equal to or smaller than about 1.46. The transparent hard mask layer 206 may be composed of a single-layered structure or a multi-layered structure, and the transparent hard mask layer 206 is formed to include undoped silicon glass.

In some examples, the transparent hard mask layer 206 is formed to have a thickness t1, which is greater than about 3000 angstrom, for effectively protecting the transparent layer 204 during the etching process of the substrate 200. In some exemplary examples, for the concern of the transmittance of the transparent hard mask layer 206 remained after the etch process and the crosstalking problem of light, the thickness t1 of the transparent hard mask layer 206 preferably ranges from about 3000 angstrom to about 4000 angstrom.

At operation 310, as shown in FIG. 2D, a carrier 208 is provided, and the device layer 210 on the second surface 200b of the substrate 200 is bonded to the carrier 208. In the example illustrated in FIG. 2C and FIG. 2D, the operation of forming the transparent hard mask layer 206 is performed before the device layer 210 on the second surface 200b of the substrate 200 is bonded to the carrier 208. However, the operation of forming the transparent hard mask layer 206 may be performed after the device layer 210 on the second surface 200b of the substrate 200 is bonded to the device layer 210. In the embodiments, the conductive layer 202, the transparent layer 204, and the transparent hard mask layer 206 may be formed before the device layer 210 is bonded to the carrier 208, or after the device layer 210 is bonded to the carrier 208.

At operation 312, as shown in FIG. 2E, a patterned etch mask layer 212 is formed on the transparent hard mask layer 206. The transparent hard mask layer 206 includes various first portions 206a and various second portions 206b, in which the patterned etch mask layer 212 is disposed on the first portions 206a, and the second portions 206b are exposed. In some exemplary examples, the patterned etch mask layer 212 is formed from photo-resist, and the operation of forming the patterned etch mask layer 212 includes blanketly forming an etch mask layer to cover the transparent hard mask layer 206, and performing a photolithography process on the etch mask layer to remove portions of the etch mask layer so as to form the patterned etch mask layer 212. In certain examples, the patterned etch mask layer 212 is not formed from a photo-resist, and the operation of forming the patterned etch mask layer 212 includes blanketly forming an etch mask layer to cover the transparent hard mask layer 206, and performing a photolithography process and an etch process on the etch mask layer to remove portions of the etch mask layer so as to form the patterned etch mask layer 212.

At operation 314, referring to FIG. 2E again, an etch process is performed through the patterned etch mask layer 212 to remove the second portions 206b of the transparent hard mask layer 206, and various portions of the transparent layer 204, various portions of the conductive layer 202, and various portions of the substrate 200, which underlie the second portions 206b of the transparent hard mask layer 206. During the etch process, the portions of the substrate 200 are removed from the first surface 200a to the second surface 200b of the substrate 200. As shown in FIG. 2F, after the etching process is completed, various through holes 214 are formed to pass through the transparent hard mask layer 206, the transparent layer 204, the conductive layer 202, and the substrate 200, and to respectively expose various portions 210a of the device layer 210. For example, the etch process may be performed by using a dry etch technique. In some exemplary examples, the etch process is performed to expose the image sensors and the interconnect structures of the device layer 210, and various contacts may be formed in these through holes 214 to electrically connect to the image sensors and the interconnect structures of the device layer 210.

In some examples, in the etch process, the second portions 206b of the transparent hard mask layer 206 and the portions of the transparent layer 204 are etched through the patterned etch mask layer 212 to expose the portions of the conductive layer 202, and the exposed portions of the conductive layer 202 are etched through the patterned etch mask layer 212 and the transparent hard mask layer 206, and then the portions of the substrate 200 are etched through the transparent hard mask layer 206, or through the patterned etch mask layer 212 and the transparent hard mask layer 206. After the etch process is completed, portions of the patterned etch mask layer 212 may be still remained, such that the substrate 200 is etched through the patterned etch mask layer 212. For example, after the etch process is completed, the remained patterned etch mask layer 212 is removed by using an ashing process or a wet strip process, so as to substantially complete a semiconductor device 216.

In the examples illustrated in FIG. 2F, the patterned etch mask layer 212 is completely consumed during the etch process, such that the transparent hard mask layer 206 acts as an etch mask to protect the transparent layer 204 during the portions of the substrate 200 are etched. In some exemplary examples, after the etch process is completed, a part of the transparent hard mask layer 206 is etched by the etchant, such that the thickness t1 of the transparent hard mask layer 206 is reduced to a thickness t2. In some exemplary examples, the thickness t2 of the transparent hard mask layer 206 ranges from 1000 angstrom to 2000 angstrom.

In accordance with an embodiment, the present disclosure discloses a semiconductor device. The semiconductor device includes a substrate, a conductive layer, a transparent layer, a transparent hard mask layer, a carrier, and a device layer. The substrate has a first surface and a second surface opposite to each other. The conductive layer is disposed on the first surface of the substrate. The transparent layer is disposed on the conductive layer. The transparent hard mask layer is disposed on the transparent layer, in which the substrate has an etch selectivity with respect to the transparent hard mask layer. The device layer is disposed between the carrier and the second surface of the substrate, in which various portions of the device layer are respectively exposed by various through holes which pass through the transparent hard mask layer, the transparent layer, the conductive layer, and the substrate.

In accordance with another embodiment, the present disclosure discloses a method for manufacturing a semiconductor device. In this method, a substrate is provided, in which the substrate has a first surface and a second surface opposite to each other, and providing the substrate includes bonding the second surface to a carrier. A conductive layer is formed on the first surface of the substrate. A transparent layer is formed on the conductive layer. A transparent hard mask layer is formed on the transparent layer. A patterned etch mask layer is formed on various first portions of the transparent hard mask layer, in which various second portions of the transparent hard mask layer are exposed. An etch process is performed through the patterned etch mask layer to remove the second portions of the transparent hard mask layer, various portions of the transparent layer, various portions of the conductive layer, and various portions of the substrate, in which the portions of the substrate are removed from the first surface to the second surface of the substrate.

In accordance with yet another embodiment, the present disclosure discloses a method for manufacturing a semiconductor device. In this method, a substrate is provided, in which the substrate has a first surface and a second surface opposite to each other. A device layer is formed on the second surface of the substrate. A conductive layer is formed on the first surface of the substrate. A transparent layer is formed on the conductive layer. A transparent hard mask layer is formed on the transparent layer. A patterned etch mask layer is formed on various portions of the transparent hard mask layer. The device layer is bonded to a carrier. The transparent hard mask layer and the transparent layer are etched through the patterned etch mask layer. The conductive layer and the substrate are etched through the patterned etch mask layer and the transparent hard mask layer to expose various portions of the device layer, in which an etch rate of the substrate is greater than an etch rate of the transparent hard mask layer, and the patterned etch mask layer is removed during etching the conductive layer and the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate having a first surface and a second surface opposite to each other;
   a conductive layer disposed on the first surface of the substrate;
   a transparent silicon dioxide layer disposed on the conductive layer;
   a transparent undoped silicon glass layer disposed on the transparent silicon dioxide layer, wherein the substrate has an etch selectivity with respect to the transparent undoped silicon glass;
   a carrier; and
   a device layer including a plurality of image sensors and disposed between the carrier and the second surface of the substrate.

2. The semiconductor device of claim 1, wherein the etch selectivity is substantially greater than 3.

3. The semiconductor device of claim 1, wherein a thickness of the transparent undoped silicon glass layer substantially ranges from 1000 angstrom to 2000 angstrom.

4. The semiconductor device of claim 1, wherein a reflective index of the transparent undoped silicon glass layer is substantially equal to or smaller than 1.46.

5. The semiconductor device of claim 1, wherein the image sensors are near-infrared image sensors.

6. A method for manufacturing a semiconductor device, the method comprising:

providing a substrate, wherein the substrate has a first surface and a second surface opposite to each other, and providing the substrate comprises bonding the second surface to a carrier;

forming a device layer including a plurality of image sensors over the substrate;

forming a conductive layer on the first surface of the substrate;

forming a transparent layer on the conductive layer;

forming a transparent hard mask layer on the transparent layer;

forming a patterned etch mask layer on a plurality of first portions of the transparent hard mask layer, wherein a plurality of second portions of the transparent hard mask layer are exposed; and performing an etch process through the patterned etch mask layer to remove the second portions of the transparent hard mask layer, a plurality of portions of the transparent layer, a plurality of portions of the conductive layer, and a plurality of portions of the substrate, wherein the portions of the substrate are removed from the first surface to the second surface of the substrate, and the patterned etch mask layer is consumed by an etchant of the etch process to expose the first portions of the transparent hard mask layer during removing the portions of the substrate.

7. The method of claim 6, wherein the device layer is formed on the second surface of the substrate, bonding the second surface to the carrier comprises bonding the device layer on the second surface to the device layer, and performing the etch process comprises exposing portions of the device layer.

8. The method of claim 7, wherein the device layer is formed to comprise a plurality of near-infrared image sensors.

9. The method of claim 6, wherein the substrate comprises silicon, the transparent layer comprises silicon dioxide, and the transparent hard mask layer comprises undoped silicon glass.

10. The method of claim 6, wherein a ratio of an etch rate of the substrate relative to an etch rate of the transparent hard mask layer is substantially greater than 3, and the transparent hard mask layer is formed to have a thickness which is greater than 3000 angstrom.

11. The method of claim 6, wherein forming the transparent hard mask layer is performed after the second surface of the substrate is bonded to the carrier.

12. The method of claim 6, wherein forming the transparent hard mask layer is performed before the second surface of the substrate is bonded to the carrier.

13. The method of claim 6, wherein performing the etch process comprises:

etching the second portions of the transparent hard mask layer and the portions of the transparent layer through the patterned etch mask layer;

etching the portions of the conductive layer through the patterned etch mask layer and the transparent hard mask layer; and etching the portions of the substrate through the patterned etch mask layer and the transparent hard mask layer.

14. A method for manufacturing a semiconductor device, the method comprising:

providing a substrate, wherein the substrate has a first surface and a second surface opposite to each other;

forming a device layer that includes a plurality of image sensors on the second surface of the substrate;

forming a conductive layer on the first surface of the substrate;

forming a transparent layer on the conductive layer;

forming a transparent hard mask layer on the transparent layer;

bonding the device layer to a carrier;

forming a patterned etch mask layer on a plurality of portions of the transparent hard mask layer;

etching the transparent hard mask layer and the transparent layer through the patterned etch mask layer; and etching the conductive layer and the substrate through the patterned etch mask layer and the transparent hard mask layer to expose a plurality of portions of the device layer, wherein an etch rate of the substrate is greater than an etch rate of the transparent hard mask layer, and the patterned etch mask layer is removed after etching the conductive layer and before etching the substrate is complete.

15. The method of claim 14, wherein the device layer is formed to comprise a plurality of near-infrared image sensors.

16. The method of claim 14, wherein the substrate comprises silicon, the transparent layer comprises silicon dioxide, and the transparent hard mask layer comprises undoped silicon glass.

17. The method of claim 14, wherein a ratio of the etch rate of the substrate relative to the etch rate of the transparent hard mask layer is substantially greater than 3, and the transparent hard mask layer is formed to have a thickness which is greater than 3000 angstrom.

18. The method of claim 14, wherein forming the transparent hard mask layer is performed after the device layer is bonded to the carrier.

19. The method of claim 14, wherein forming the transparent hard mask layer is performed before the device layer is bonded to the carrier.

20. The semiconductor device of claim 1, wherein the transparent undoped silicon glass layer is in contact with the transparent silicon dioxide layer.

* * * * *